United States Patent
Aoyagi et al.

(10) Patent No.: US 6,911,665 B2
(45) Date of Patent: Jun. 28, 2005

(54) SUPERCONDUCTING INTEGRATED CIRCUIT AND METHOD FOR FABRICATION THEREOF

(75) Inventors: Masahiro Aoyagi, Tsukuba (JP); Hiroshi Nakagawa, Tsukuba (JP); Kazuhiko Tokoro, Tsukuba (JP); Katsuya Kikuchi, Tsukuba (JP); Hiroshi Itatani, Yokohama (JP); Sigemasa Segawa, Yokohama (JP)

(73) Assignees: National Institute of Advanced Industrial Science and Technology, Tokyo (JP); PI R&D Co., Ltd., Yokohama (JP)

( * ) Notice: Subject to any disclaimer, the term of this patent is extended or adjusted under 35 U.S.C. 154(b) by 0 days.

(21) Appl. No.: 10/631,791

(22) Filed: Aug. 1, 2003

(65) Prior Publication Data
US 2004/0056335 A1 Mar. 25, 2004

(30) Foreign Application Priority Data
Aug. 1, 2002 (JP) ........................... 2002-224293
Dec. 26, 2002 (JP) ........................... 2002-375882

(51) Int. Cl.[7] ............................................. H01L 39/22
(52) U.S. Cl. ........................ 257/32; 257/31; 257/33; 505/191; 505/233
(58) Field of Search ............................ 257/31, 32, 33; 505/191, 233

(56) References Cited

U.S. PATENT DOCUMENTS

| | | | | |
|---|---|---|---|---|
| 4,942,142 A | * | 7/1990 | Itozaki et al. | 505/233 |
| 5,068,694 A | * | 11/1991 | Ohara | 257/32 |
| 6,441,394 B2 | * | 8/2002 | Kasai et al. | 257/31 |

OTHER PUBLICATIONS

Murduck et al, IEEE Transactions on Applied Superconductivity, vol. 9, No. 2 Jun. 1999, pp 3354–3357, "HTS . . . smoothness".*

* cited by examiner

Primary Examiner—Jerome Jackson
(74) Attorney, Agent, or Firm—Oblon, Spivak, McClelland, Maier & Neustadt, P.C.

(57) ABSTRACT

A superconducting integrated circuit includes a substrate, a multilayer structure formed on the substrate and composed of a lower superconducting electrode, a tunnel barrier and an upper superconducting electrode sequentially joined together upward in the order mentioned, and an insulating layer perforated to form via holes to get electrical contacts with the lower and upper electrodes. The insulating layer is formed of a high-resolution, photosensitive, solvent-soluble, organic insulating material. The superconducting integrated circuit is produced by a method that includes the steps of depositing the multilayer on the substrate, applying the insulating material to the front surface of the substrate inclusive of the multilayer, forming the via holes in the insulating material by the lithographic technique at the prospective positions to get electrical contacts with the upper and lower electrodes, and laying wirings for connecting the upper and lower electrodes through the via holes.

5 Claims, 5 Drawing Sheets

US 6,911,665 B2

SUPERCONDUCTING INTEGRATED CIRCUIT AND METHOD FOR FABRICATION THEREOF

BACKGROUND OF THE INVENTION

1. Field of the Invention

This invention relates to a superconducting integrated circuit that has included superconducting components, such as superconducting tunnel junction components and microbridge components, and to a method for the fabrication thereof.

2. Description of the Prior Art

Heretofore, in the fabrication of a superconducting tunnel junction (Josephson) device which is an active component in a superconducting integrated circuit, a silicon oxide film or silicon nitride film has been used as the material for an insulating interlayer film intended to effect insulation between an upper electrode and a lower electrode. The insulation characteristics and dielectric characteristics of the insulating film have an effect on the signal transmission characteristics of the wiring and on the electric characteristics of the superconducting tunnel junction device as well. Particularly, the changes in the characteristic properties of the junction component have a great effect as well on the operation characteristics of the superconducting integrated circuit and, therefore, have posed an important problem to be solved.

Thus, the material that is used for the insulating interlayer film is expected to excel in the insulating characteristics and to show a low dielectric constant. A material which is capable of fully satisfying these conditions and is as well applicable to the fabrication of a superconducting tunnel junction device has not been reported until now.

As heretofore known means for forming an insulating film, there are at present available a method of producing an insulating interlayer film that comprises depositing an insulating film on the entire surface of a substrate by the technique of sputtering or the technique of evaporation using vacuum equipment, then patterning the insulating film by means of a photo resist and forming via holes in the insulating film by the technique of dry etching, and a method of forming an insulating interlayer film that comprises applying a photo resist to a substrate, patterning the applied layer of photo resist, depositing an insulating film on the patterned layer of photo resist by the technique of sputtering or the technique of evaporation using vacuum equipment and separating unnecessary layers by the lift-off technique. These methods invariably necessitate use of highly expensive vacuum equipment and encounter difficulty in ensuring reliability of the formation of via holes because they entail large numbers of steps.

Now, the process for fabricating a superconducting tunnel junction device that uses a conventional insulating interlayer film, such as of low-temperature-formed silicon dioxide, will be described below with reference to FIG. 4 and FIG. 5.

FIG. 4 depicts a process for forming an insulating interlayer film that comprises depositing an insulating film, applying a photo resist to the entire surface of a substrate, patterning the layer of photo resist by the lithographic technique and forming via holes in the layers by the dry etching technique.

First, a protective layer 2 against dry etching is formed on a substrate 1, a tunnel junction having a structure of upper electrode 4 tunnel barrier 5/lower electrode 3 is deposited by the sputtering technique, then a resist pattern for the lower electrode and a resist pattern for the upper electrode are formed by the photolithographic technique, and a tunnel junction component and a lower wiring layer are respectively worked out by dry etching, as illustrated in FIG. 4(a).

Subsequently, an insulating layer 21 of a silicon dioxide film, silicon oxide film or silicon nitride film is deposited on the entire surface of the substrate 1 by the sputtering technique or the evaporation technique without heating the substrate for the purpose of insulating the upper and lower electrodes 4 and 3, as illustrated in FIG. 4(b). Incidentally, since the superconducting tunnel junction component, when heated to a temperature of higher than 150° C., induces deterioration of the electrical properties, it is a general rule to avoid heating the substrate in the fabrication process.

Furthermore, a photo resist 22 is applied onto the entire surface of the insulating film on the substrate 1, as illustrated in FIG. 4(c).

Next photo resist patterns 23a and 23b, which are intended to be used for forming via holes in the insulating layer to get electrical contacts with the upper and lower electrodes, are formed by the use of the photolithographic technique, as illustuated in FIG. 4(d).

Subsequently, via holes 24a and 24b respectively reaching the electrodes 3 and 4 are formed by the technique of dry etching using vacuum equipment as illustrated in FIG. 4(e).

Next, the photo resists are removed to complete an insulating interlayer film, as illustrated in FIG. 4(f).

Finally, a wiring electrode layer is deposited over the entire source of the substrate by the sputtering technique, then photo resist patterns to be used for wiring are formed by the photolithographic technique, and a wiring 8 is formed by dry etching to complete a superconducting tunnel device, as illustrated in FIG. 4(g).

FIG. 5 depicts a process which comprises applying a photo resist to the entire surface of a substrate, imparting shapes of prospective via holes to the applied layer of the photo resist by the lithographic technique, then depositing an insulating film, and forming an insulating interlayer film by the lift-off technique.

First, a protective layer 2 against dry etching is formed on a substrate 1, a tunnel junction having the structure of upper electrode 4/tunnel barrier 5/lower electrode 3 is deposited thereon, then a lower electrode pattern and an upper electrode pattern are formed by the photolithographic technique, and a tunnel junction component and a lower wiring layer are formed by dry etching, as illustrated in FIG. 5(a).

A photo resist 22 is subsequently applied to the entire surface of the substrate 1, as illustrated in FIG. 5(b).

Next, the photo resist is removed from the applied layer of photo resist excepting the positions at which the via holes to get electrical contacts with the upper electrode 4 and the lower electrode 3 are expected to be formed by the use of the photolithographic technique to form the photo resist patterns 22a and 22b in the shapes of the prospective via holes, as illustrated in FIG. 5(c).

Subsequently, an insulating layer 21, such as of a silicon dioxide film, silicon oxide film or silicon nitride film is deposited by the sputtering technique or the evaporation technique on the entire surface of the substrate 1 with the object of insulating the upper and lower electrodes, as illustrated in FIG. 5(d).

The photo-resist patterns 22a and 22b are removed by the lift-off technique to complete an insulating interlayer film as illustrated in FIG. 5(e).

Finally, a wiring electrode layer is deposited on the entire surface of the insulating interlayer film by the sputtering technique, then the photo resist pattern to be used for wiring is formed by the photolithographic technique, and a wiring layer is worked out by dry etching to form a wire 8 to complete a superconducting tunnel component, as illustrated in FIG. 5(*f*).

As already pointed out, in the insulating film which is intended to effect electric insulation of the upper electrode and the lower electrode in the production of the superconducting tunnel junction (Josephson) device, the insulating characteristics and the dielectric characteristics thereof may affect even the characteristic properties of the superconducting tunnel junction device. If the insulating film exhibits inferior insulating characteristics and entails the occurrence of a leak current, for example, these defects will manifest themselves in a form superposed on the subgap leak property of a junction component. Thus, the changes in the characteristic properties of the junction component greatly affect the operation characteristics of the superconducting integrated circuit. In terms of these insulating characteristics and dielectric characteristics, the low-temperature-formed silicon oxide film and silicon nitride film that have been used as the materials for the conventional insulating films have not been fully satisfactory. Particularly, since the silicon oxide film contains oxygen, it has proved to be an unfavorable material for the niobium superconductor that tends to induce deterioration of the superconducting property by diffusion of oxygen. Since the formation of via holes in the insulating layer is implemented by dry etching, the wiring layer and the resistor layer which are exposed after the formation of via holes suffer loss of thickness due to dry etching and sustain damage of dry etching and consequently pose a serious hindrance to the formation of proper electrical contacts.

The insulating layer of the signal line is preferably made of a material having a low dielectric constant because the signal transmission speed through this line increases in proportion as the dielectric constant of the insulating interlayer film decreases.

An object of this invention is to provide a superconducting integrated circuit which permits the technique for forming an insulating interlayer film to be simplified because of a marked decrease in the number of steps as compared with the conventional technique, enjoys an enhanced reliability of the wiring, and enables the yield of device to be exalted and to provide a method for the mass production thereof.

Another object of this invention is to provide a superconducting integrated circuit which permits an insulating film to be deposited by a simple and convenient method of application without using vacuum equipment, allows a decrease in the number of steps of process by forming via holes exclusively by the lithographic technique, and consequently enjoys an enhanced reliability of the process for the formation of via holes.

SUMMARY OF THE INVENTION

The superconducting integrated circuit contemplated by this invention comprises a substrate, a multilayer structure formed on the substrate and composed of a lower superconducting electrode, a tunnel barrier and an upper superconducting electrode sequentially joined together upward in the order mentioned, and an insulating layer perforated to form via holes to get electrical contacts with the lower electrode and the upper electrode, the insulating layer being formed of a high-resolution, photosensitive, solvent-soluble, organic insulating material.

The method for the production of a superconducting integrated circuit contemplated by this invention comprises depositing on a substrate a multilayer of a lower superconducting electrode, a tunnel barrier and an upper superconducting electrode sequentially deposited upward in the order mentioned, applying a high-resolution, photosensitive, solvent-soluble, organic insulating material to a front surface of the substrate inclusive of the multilayer, forming via holes in the insulating material by a lithographic technique at prospective positions to get electrical contacts with the upper electrode and the lower electrode, and laying wirings for connecting the upper electrode and the lower electrode through the via holes.

As the insulating material, a photosensitive solvent-soluble polyimide can be used advantageously.

The method for the production further comprises disposing a resistor additionally on the substrate before applying the insulating material, and perforating the insulating layer to form a via hole to get electrical contacts with the resistor.

The superconducting integrated circuit of this invention, owing to the use of a photosensitive organic film having high-resolution characteristics of the level of microns to submicrons as an insulating film, is enabled to attain the formation of via holes in the insulating layer exclusively by the lithographic technique. Thus, the method for producing this integrated circuit is simplified through a marked decrease in the number of steps of process as compared with the conventional technique for the formation of the insulating interlayer film. By applying the high-resolution, photosensitive, organic material by the spin coating technique to the irregular surfaces of the electrodes and the wiring layers manufactured in the preceding step, thereby utilizing the excellent coating property of the material in smoothing the steps, it is made possible at the subsequent step for upper wiring to attain much reduction in the number of defective portions as by decreasing portions of steps to be climbed over. These improvements are at an advantage in enhancing the reliability of the process of wiring and exalting the yield of production of integrated circuit.

The above and other objects, features and advantages of the present invention will become apparent from the description made herein below with reference to the accompanying drawings.

DESCRIPTION OF THE PREFERRED EMBODIMENT

As the first embodiment of this invention, the method for producing a superconducting tunnel device constituting a superconducting integrated circuit will be described below with reference to FIG. 1.

Figure 1A:
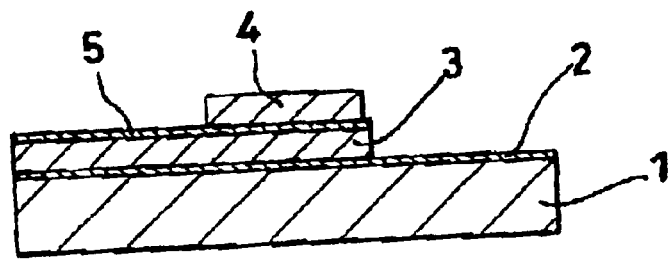
FIGS. 1(*a*) to 1(*d*) are diagrams depicting the flow of the process of producing a superconducting tunnel device constituting a superconducting integrated circuit as the first embodiment of this invention.

A protective layer 2 of MgO film against dry etching is formed on a substrate 1. A tunnel junction layer having a multilayer structure of Nb upper electrode 4/AlO$_x$ tunnel barrier 5/Nb lower electrode 3 is deposited thereon, then a resist pattern for the lower electrode and a twist pattern for the upper electrode are formed by the photolithographic technique. A tunnel junction layer is defined by dry etching through these resist patterns, as illustrated in FIG. 1(a).

Figure 1B:
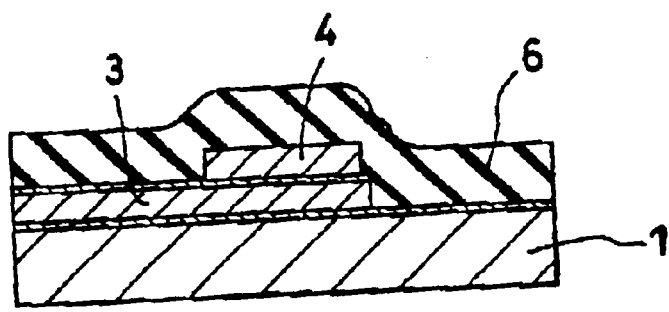

Subsequently, a high-resolution, photosensitive, solvent-soluble, organic material, such as a photosensitive solvent-soluble block-copolyimide, is applied to the entire surface of the substrate 1 to give rise to an insulating film for insulating the upper and lower electrodes 4 and 3 from each other, as illustrated in FIG. 1(b). The application on this occasion can be done easily and conveniently by spin coating or screen-printing without using vacuum equipment. At this time, the thickness of the insulating film can be controlled in a very wide range, depending on the concentration and the molecular weight of the photosensitive, solvent-soluble, organic insulating material. Thereafter, the insulating film consequently formed is dried in a convection oven at a temperature of from 90° C. to 100° C. As a result, the solvent in the film is reduced and the photosensitive characteristics are stabilized.

Figure 1C:
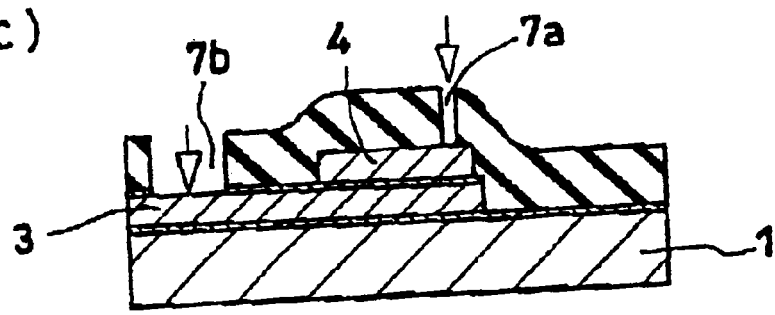

Via holes 7a and 7b to be used to get electrical contacts with the upper and lower electrodes 4 and 3 are then formed by the photolithographic technique in the insulating film using a high-resolution, photosensitive, organic insulating material 6, as illustrated in FIG. 1(c). At this time, the high-resolution, photosensitive, insulating material, such as a photosensitive block-copolyimide, is exposed to the ultraviolet light through a photo mask having the via-hole patterns incised therein in advance. Thereafter, the exposed insulating film is immersed in an alkali solution, such as a mixed solution composed of N-methyl-2-pyrrolidone, amino ethanol and water, to develop the relevant patterns by dissolving the exposed portions of the insulating material. Finally, the substrate 1 is heated to vaporize the solvent and the photosensitive material in the high-resolution, photosensitive, insulating material and complete the via holes 7a and 7b. In the lithographic process, the characteristic properties of the superconducting tunnel junction device should be retained at high grade. For this purpose, the heating temperature should remain at a level as low as possible. When the photosensitive polyimide is used, the heating temperature can be kept in a range of from 120° C. to 150° C. and the high-grade characteristic properties can be retained. The preceding procedure completes an insulating interlayer film.

Figure 1D:
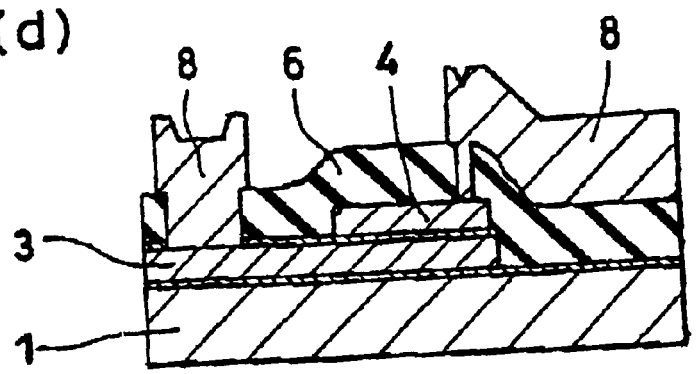

Finally, a wiring electrode layer is deposited on the entire surface of the substrate by the sputtering technique, then a photo resist pattern for the wiring is formed by the photolithographic technique. The wiring layer is worked out by dry etching to give rise to a wiring 8, as illustrated in FIG. 1(d).

Though the superconducting tunnel junction device in the preceding embodiment has been depicted as using a photosensitive, solvent-soluble, insulating layer for the peripheral insulation thereof, a photosensitive solvent-soluble insulating layer can be used as well for the insulation between the superconducting ground plane layer and the lower superconducting electrode layer and for the insulation between the superconducting wiring layer and the second superconducting wiring layer (control wiring layer).

It follows, therefore, that all the insulating layers in the superconducting integrated circuit can be photosensitive, solvent-soluble insulating layers.

The superconducting tunnel junction device which used electrodes formed of a Nb superconductor experimentally fabricated in accordance with the method of this invention was found to exhibit junction characteristics which compare favorably with the top data obtained in the use of the conventional silicon dioxide film for insulating layers and which feature very small subgap leakage. At a temperature of 4.2 K, the Vm value of the device at the voltage of 2 mV that serves as the index of device quality was 90 mV. It follows, therefore, that the superconducting integrated circuit of this invention is applicable fully satisfactorily to the superconducting radiation detector that demands junction characteristics featuring very small subgap leakage.

When a solvent-soluble polyimide was used for insulating layers, deviation was not found in the junction characteristics within the surface of the substrate. In contrast, when the conventional silicon dioxide film was used in the insulating layers, the junction characteristics strongly relied on the conditions of the film formation. It was necessary to find the optimum conditions for reducing the deviation of the junction characteristics.

After ten beat cycles between extremely low temperature of 4.2 K and room temperature, it showed no discernible change in the junction characteristics and revealed no sign of delamination or crack in the polyimide insulating layer.

FIG. 2 depicts an example of the formation of a superconducting integrated circuit inclusive of a superconducting tunnel junction and a resistor as the second embodiment of this invention.

Figure 2A:
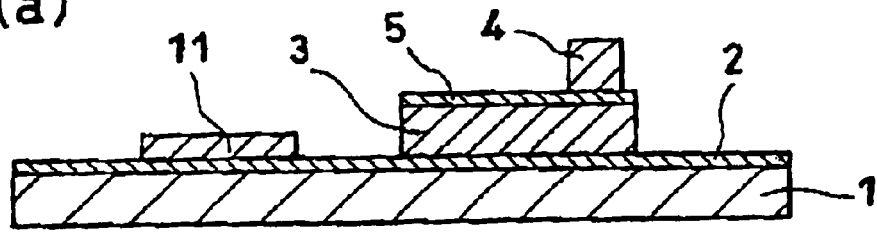
FIGS. 2(*a*) to 2(*d*) are diagram depicting the flow of the process of producing a superconducting integrated circuit inclusive of a superconducting tunnel junction and a resistor as the second embodiment of this invention.

First, a protective layer 2, such as of MgO, against dry etching is deposited by the evaporation or sputtering technique on a substrate 1, then a Nb lower electrode 3, an AlO$_x$ tunnel barrier 5 and a Nb upper electrode 4 are continuously formed by the sputtering technique, the lower electrode 3 and the upper electrode 4 are defined by dry etching through a resist pattern for the lower electrode and a resist pattern for the upper electrode, further a Pd resistor layer is deposited by the evaporation technique through a resist pattern for the resistor, and thereafter a fine resistor 11 is formed by the lift-off technique, as illustrated in FIG. 2(a). Incidentally, during the course of the dry etching, the etching ceases proceeding at the surfaces of the tunnel barrier 5 and the protective layer 2.

Figure 2B:
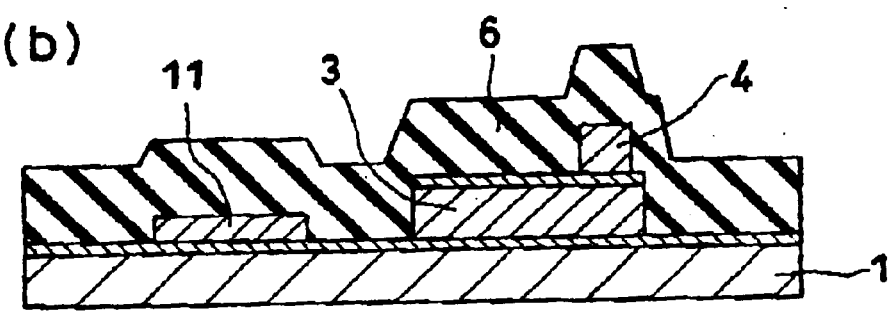

Subsequently, a high-resolution, solvent-soluble, photosensitive, organic material 6 is applied to the entire surface of the substrate 1, as illustrated in FIG. 2(b), and the applied layer consequently formed is pre-baked similarly at a temperature of from 90° C. to 100° C.

Figure 2C:
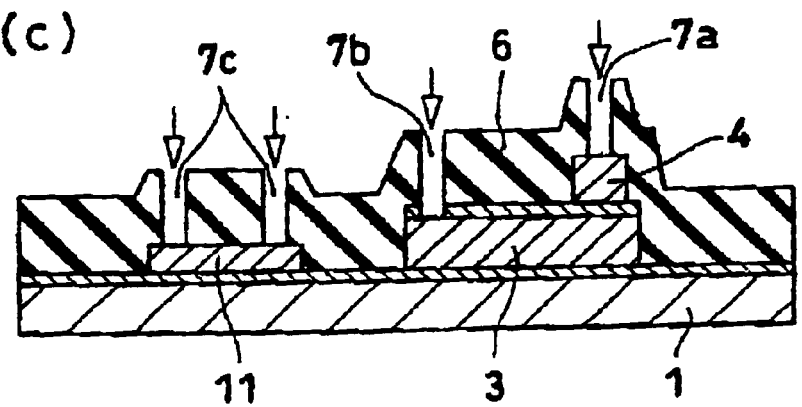

Next, the patterns of a contact hole 7c for the resistor, a contact hole 7b for the lower electrode and a contact hole 7a for the upper electrode are exposed to ultraviolet light, and the exposed patterns are developed with an alkali and then post-baked to give rise to the respective holes, as illustrated in FIG. 2(c). During the course of the development, the AlO$_x$ tunnel barrier on the lower electrode is inevitably etched by an alkali developing solution.

Figure 2D:
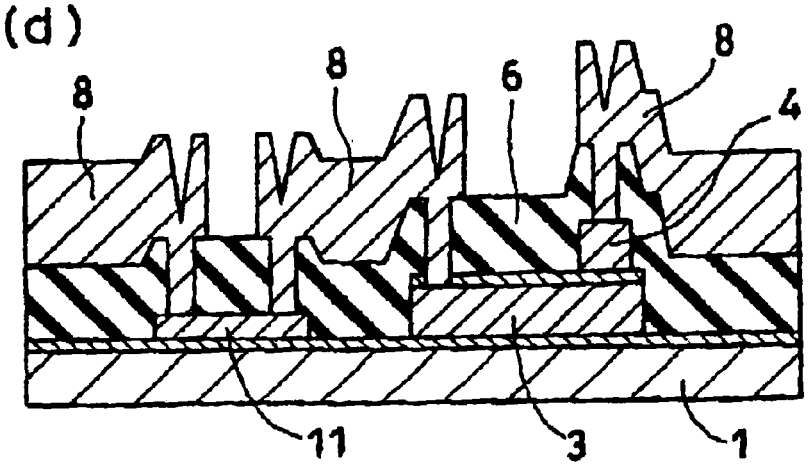

Finally, a Nb wiring layer is deposited on the entire surface, and the deposited layers are dry etched through a resist pattern for wiring to give rise to a wiring 8, as illustrated in FIG. 2(d).

The present embodiment is compared with the conventional method for fabricating a superconducting integrated circuit using an SiO$_2$ film for insulating layers. In the present embodiment, the contact holes are formed by only lithographic process with ultraviolet light. In the conventional method, the contact holes are formed by dry etching through resist patterns for contact holes on the SiO$_2$ film. Therefore, a resistor layer and an upper electrode are exposed to the etching plasma. Thus, the conventional method is required to prepare two contact patterns, one for the resistor and the other for the upper electrode, and individually optimize the dry etching conditions for the two contact patterns. Further, if the dry etching is optimized, the margin for the overetching (further etching for eliminating the residue of etching) will be inherently narrow. This defect has posed a serious hindrance to the formation of good electrical contacts. The present invention, however, is capable of providing a fabrication method that, owing to the use of a photosensitive organic material, features exceptional convenience and high reliability as well.

FIG. 3 depicts a method for producing a superconducting integrated circuit inclusive of a ground plane, a wire-bonding pad, a superconducting tunnel junction and a resistor as the third embodiment of this invention.

Figure 3A:
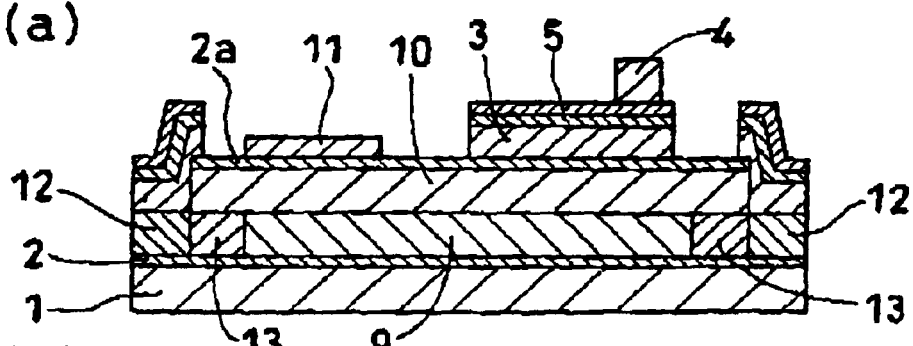
FIGS. 3(*a*) to 3(*d*) are diagrams depicting the flow of the process of producing a superconducting integrated circuit inclusive of a ground plane, a wire-bonding pad, a superconducting tunnel junction and a resistor as the third embodiment of this invention.

First, a protective layer 2, such as of MgO, against dry etching is deposited on a substrate 1 by the evaporation or sputtering technique and then a Nb ground plane 9 is formed thereon by the sputtering technique, as illustrated in FIG. 3(a). Further thereon, a SiO$_2$ insulating interlayer layer 10 is formed as by the sputtering technique, a protective layer 2a against dry etching is deposited by the evaporation or sputtering technique, then a Nb lower electrode 3, an AlO$_x$ tunnel barrier 5 and a Nb upper electrode 4 are continuously formed by the sputtering technique, the lower electrode 4 and the upper electrode 5 are defined by dry etching respectively through a resist pattern for the lower electrode and a resist pattern for the upper electrode, further a Pd resistor layer is deposited by the evaporation technique through a resist pattern for the resistor, and a fine resistor 11 is formed by the lift-off technique. Incidentally, during the course of the dry etching, the etching ceases proceeding at the surfaces of the tunnel barrier and the protective layer. From the wire-bonding pad parts 12 which are located at the outer region on the substrate, the insulating interlayer layer 10 is removed by dry etching prior to the formation of a junction tri-layer (a Nb lower electrode 3, an AlO$_x$ tunnel barrier 5 and a Nb upper electrode 4). A separating part 13 separates electrically the ground plane 9 and the wire-bonding pads 12. A groove is formed by dry etching and then refilled with SiO or poly Si.

Figure 3B:
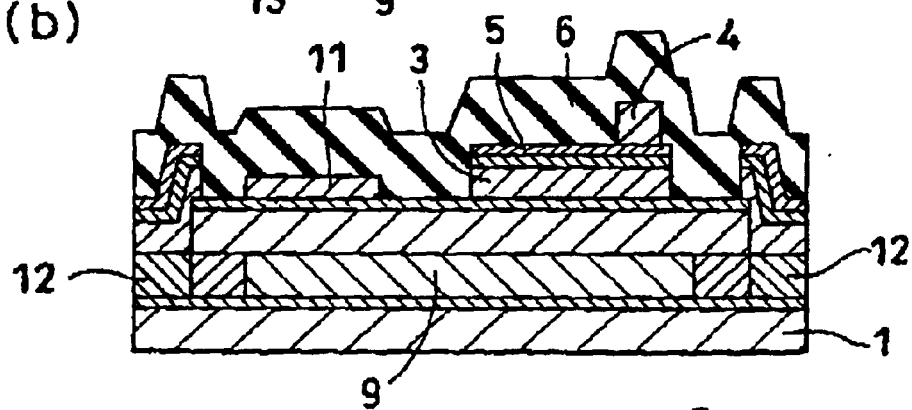

Next, a high-resolution, solvent-soluble, photosensitive, organic material 6 is applied to the entire surface of the substrate 1 and the applied layer of this material is pre-baked similarly at a temperature of from 90° C. to 100° C., as illustrated in FIG. 3(b).

Figure 3C:
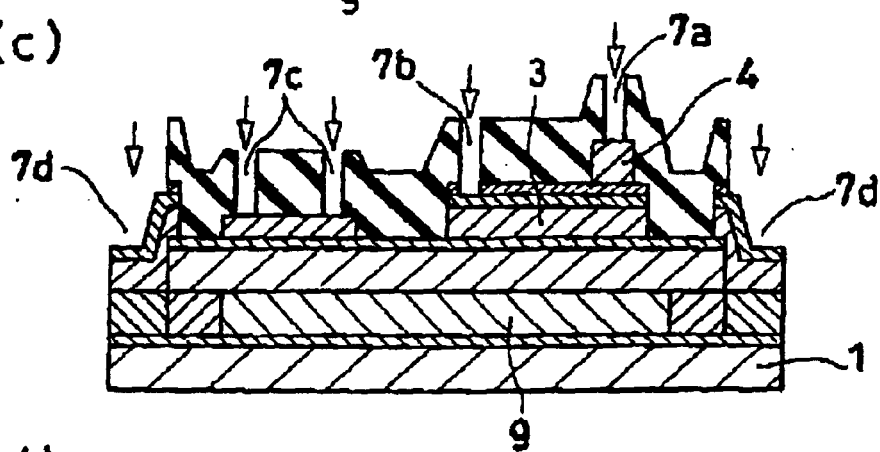

Subsequently, the patterns of a contact hole 7c for the resistor, a contact hole 7b for the lower electrode, a contact hole 7a for the upper electrode, and a contact hole 7d for the wire-bonding pads are exposed to ultraviolet light and the exposed patterns are developed and then post-baked to give rise to the respective holes, as illustrated in FIG. 3(c). Incidentally, during the course of the development, the AlO$_x$ tunnel barrier 5 on the lower electrode 3 is inevitably etched by an alkali developing solution.

Figure 3D:
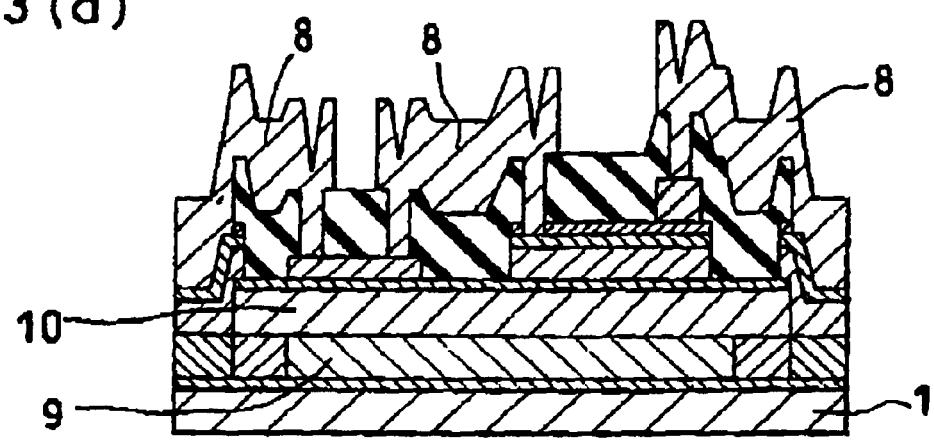
Figure 4A:
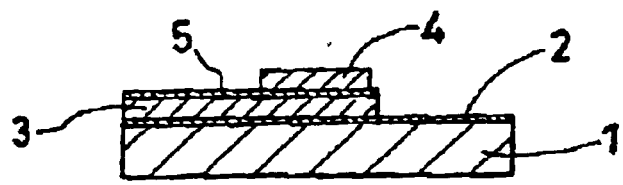
FIGS. 4(*a*) to 4(*g*) are diagrams depicting the flow of the process of forming an insulating interlayer film for a superconducting tunnel junction device as prior art FIGS. 5(*a*) to 5(*f*) are diagrams depicting the flow of the process of forming another insulating interlayer film for a superconducting tunnel junction device as prior art.
Figure 4B:
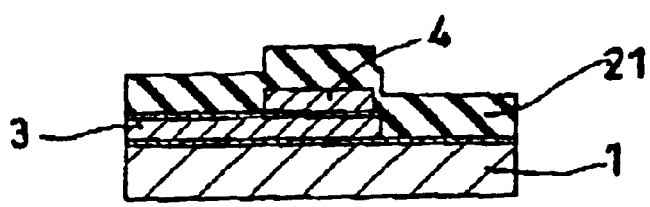
Figure 4C:
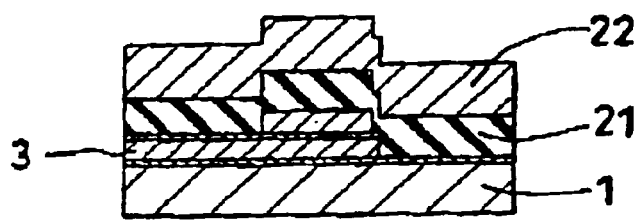
Figure 4D:
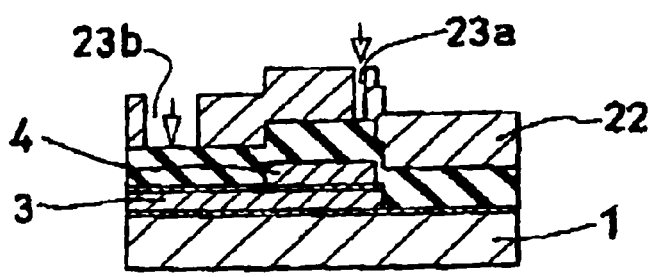
Figure 4E:
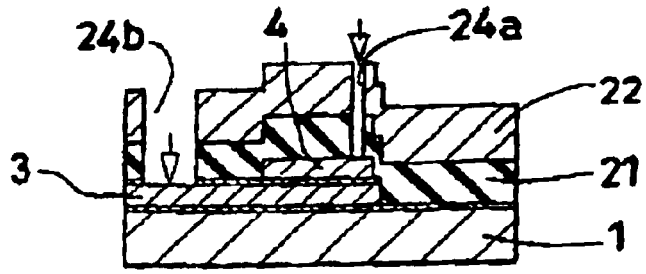
Figure 4F:
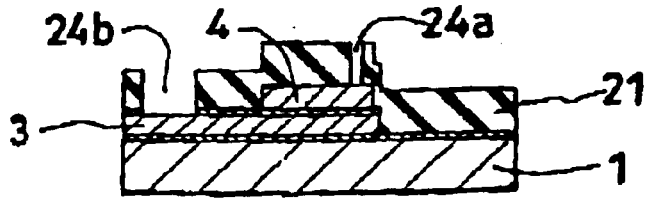
Figure 4G:
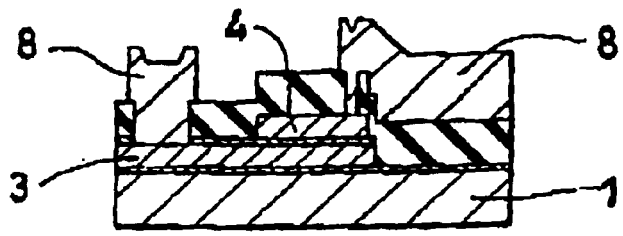
Figure 5A:
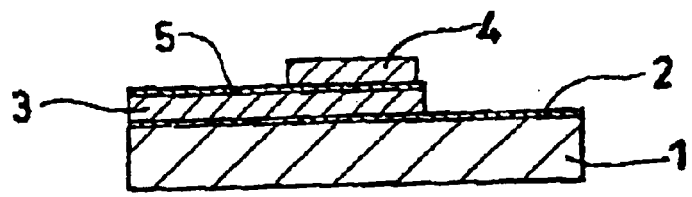
Figure 5B:
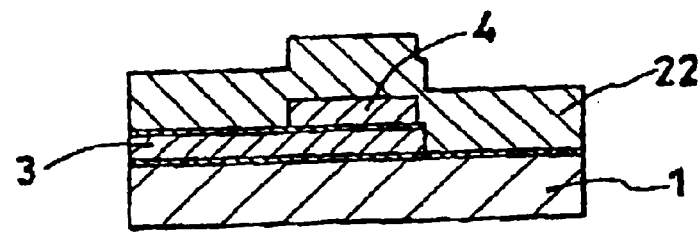
Figure 5C:
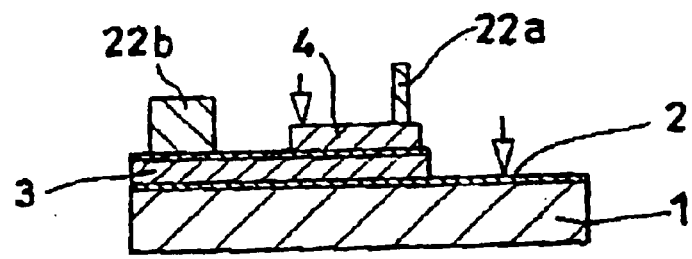
Figure 5D:
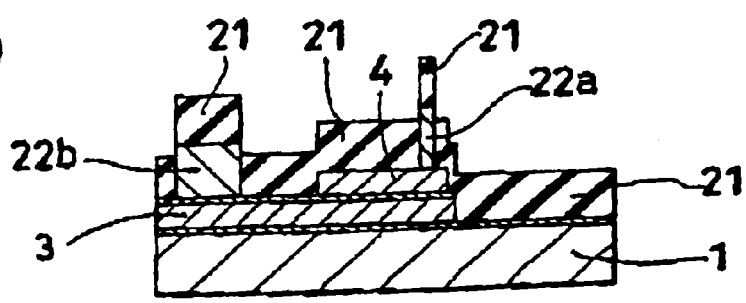
Figure 5E:
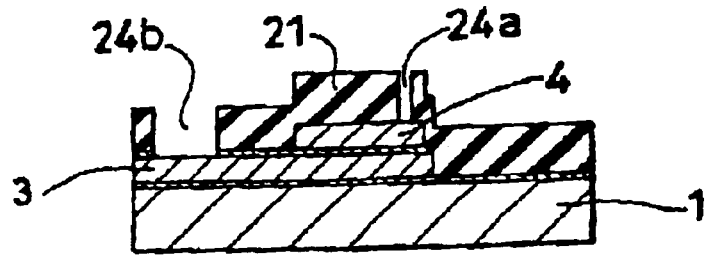
Figure 5F:
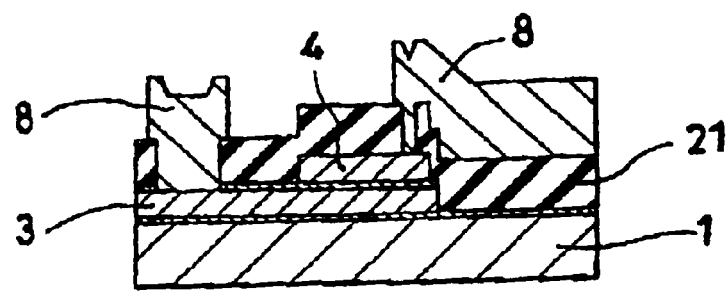

Finally, a Nb wiring layer is deposited on the entire surface by the sputtering technique and the deposited layer is dry etched through a resist pattern for the wiring to form a wiring 8, as illustrated in FIG. 3(d).

In accordance with this invention, a photosensitive organic material with high resolution of the grade from microns to submicrons, particularly a photosensitive polyimide, is used as an insulating film in a superconducting integrated circuit This high-resolution, photosensitive, organic material is coated by spin coating on the irregular surfaces of electrodes and wiring layers prepared at the preceding step. The planarized surface of the organic insulating layer is obtained. The formation of the insulating layer is accomplished without using expensive vacuum equipment. The via holes in the insulating layers are exclusively formed by the lithographic technique. Finally, much reduction in the fabrication cost and marked simplification of the fabrication process are achieved.

Further, the high-resolution, photosensitive, organic material, particularly a photosensitive polyimide, that is used as an insulation film has good insulating properties. It is made possible to obtain an excellent junction that has desirable junction characteristics that feature a very small subgap leak current. Since the dielectric constant of the insulating interlayer film is so small as to reach around 3 (incidentally, that of silicon oxide is 4), the wiring is enabled to transmit a very high-speed signal.

What is claimed is:

1. A superconducting integrated circuit comprising:
   a substrate;
   a multilayer structure formed on said substrate and composed of a lower Nb superconducting electrode, a tunnel barrier and an upper Nb superconducting electrode sequentially joined together upward in the order mentioned; and
   an insulating layer perforated to form via holes to get electrical contacts with said lower electrode and said upper electrode, said insulating layer being formed of a high-resolution, photosensitive, solvent-soluble block-copolyimide.

2. The superconducting integrated circuit according to claim 1, further comprising a resistor additionally disposed on said substrate and a via hole formed in said insulating layer to get electrical contacts with said resistor.

3. The superconducting integrated circuit according to claim 1, wherein a temperature of a heat treatment for forming said insulating layer is in a range of 120° C. to 150° C.

4. The superconducting integrated circuit according to claim 1, wherein the insulating layer is between the substrate and the lower Nb superconducting electrode.

5. The superconducting integrated circuit according to claim 4, wherein the insulating layer is between a superconducting wiring layer and the upper Nb superconducting electrode.

* * * * *